United States Patent
Dayde et al.

(10) Patent No.: US 12,327,003 B2
(45) Date of Patent: Jun. 10, 2025

(54) SELECTION OF A VIEWPOINT OF A SET OF OBJECTS IN A BOUNDING BOX

(71) Applicant: DASSAULT SYSTEMES, Velizy Villacoublay (FR)

(72) Inventors: Guillaume Dayde, Grasse (FR); Christophe Delfino, Laurent du Var (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 1373 days.

(21) Appl. No.: 14/984,527

(22) Filed: Dec. 30, 2015

(65) Prior Publication Data

US 2016/0188159 A1    Jun. 30, 2016

(30) Foreign Application Priority Data

Dec. 30, 2014 (EP) .................. 14307217

(51) Int. Cl.
  *G06F 3/04815* (2022.01)
  *G06F 30/00* (2020.01)
  (Continued)

(52) U.S. Cl.
  CPC .......... *G06F 3/04815* (2013.01); *G06F 30/00* (2020.01); *G06T 15/08* (2013.01);
  (Continued)

(58) Field of Classification Search
  CPC ...... G06F 3/04815; G06F 17/50; G06F 30/30; G06T 15/08; G06T 17/20; G06T 19/20;
  (Continued)

(56) References Cited

U.S. PATENT DOCUMENTS 5,583,977 A * 12/1996 Seidl ................... G06F 3/04845
                                                    345/619
5,588,098 A * 12/1996 Chen ................... G06F 3/04845
                                                    345/653
(Continued)

FOREIGN PATENT DOCUMENTS

EP    2 800 064 A1    11/2014
JP    10-143682 A     5/1998
(Continued)

OTHER PUBLICATIONS

Partial European Search Report dated Oct. 16, 2015 in European Patent Application No. 14307217.1.
(Continued)

*Primary Examiner* — Tadesse Hailu
(74) *Attorney, Agent, or Firm* — Oblon, McClelland, Maier & Neustadt, L.L.P.

(57) ABSTRACT

A computer-implemented method for selecting a viewpoint of a set of objects in a bounding box. The bounding box comprising at least one volume wherein the set of objects is enclosed. The method comprises identifying faces of the at least one volume, associating with each identified face a viewpoint on the set of object, selecting, upon user action, one of the faces associated with one viewpoint, and displaying a view of the set of objects according to the viewpoint associated with the selected face.

17 Claims, 5 Drawing Sheets

(51) Int. Cl.
G06T 15/08 (2011.01)
G06T 17/20 (2006.01)
G06T 19/20 (2011.01)

(52) U.S. Cl.
CPC .............. *G06T 17/20* (2013.01); *G06T 19/20* (2013.01); *G06T 2200/24* (2013.01); *G06T 2210/12* (2013.01); *G06T 2219/2016* (2013.01)

(58) Field of Classification Search
CPC ............ G06T 2200/24; G06T 2210/12; G06T 2219/2016
See application file for complete search history.

(56) References Cited

U.S. PATENT DOCUMENTS

| | | | | |
|---|---|---|---|---|
| 5,914,721 | A * | 6/1999 | Lim | G06T 15/40 |
| | | | | 345/422 |
| 6,222,557 | B1 * | 4/2001 | Pulley, IV | G06T 11/206 |
| | | | | 715/205 |
| 7,216,305 | B1 * | 5/2007 | Jaeger | G06F 3/033 |
| | | | | 715/848 |
| 9,035,944 | B2 * | 5/2015 | Werline | G06T 19/20 |
| | | | | 345/419 |
| 11,567,628 | B2 * | 1/2023 | Sadacharam | G06T 19/20 |
| 2004/0222988 | A1 * | 11/2004 | Donnelly | A63F 13/10 |
| | | | | 345/419 |
| 2005/0081161 | A1 * | 4/2005 | MacInnes | G06F 17/5004 |
| | | | | 715/765 |
| 2007/0057455 | A1 * | 3/2007 | Verdes | A63F 9/0842 |
| | | | | 273/153 S |
| 2007/0198581 | A1 * | 8/2007 | Nonclercq | G06F 30/00 |
| 2008/0238916 | A1 * | 10/2008 | Ghosh | G06T 19/00 |
| | | | | 345/419 |
| 2009/0222768 | A1 * | 9/2009 | Roe | G06F 16/283 |
| | | | | 715/850 |
| 2010/0169836 | A1 * | 7/2010 | Stallings | G06F 3/04817 |
| | | | | 715/848 |
| 2011/0137892 | A1 * | 6/2011 | Bisson | G06T 15/06 |
| | | | | 707/E17.044 |
| 2012/0310605 | A1 * | 12/2012 | Abe | G06F 30/23 |
| | | | | 703/1 |
| 2013/0346911 | A1 * | 12/2013 | Sripada | G06T 19/003 |
| | | | | 715/782 |
| 2015/0279087 | A1 * | 10/2015 | Myers | G06F 17/15 |
| | | | | 345/420 |
| 2016/0162244 | A1 * | 6/2016 | Christmas | H04N 21/4312 |
| | | | | 345/1.3 |

FOREIGN PATENT DOCUMENTS

| | | |
|---|---|---|
| JP | 2009-69879 A | 4/2009 |
| JP | 2010-287233 A | 12/2010 |
| JP | 2012-221416 A | 11/2012 |
| JP | 2013-84241 A | 5/2013 |
| JP | 2014-219975 A | 11/2014 |

OTHER PUBLICATIONS

Partial European Search Report dated Oct. 16, 2015 in European Patent Application No. 14307216.3.
Anonymous: "Using the ViewCube (Maya) Autodesk Knowledge Network", Sep. 9, 2014, XP055219222, Retrieved from the Internet: URL:http://knowledge.autodesk.com/support/maya/learn-explore/caas/CloudHelp/cloudhelp/2015/ENU/Maya/files/Viewing-the-scene-Using-the-ViewCube-htm.html [retrieved on Oct. 8, 2015].
Autodesk 3ds Max Learning Channel: "Using the ViewCube and SteeringWheels", Jan. 11, 2011, XP054976129, Retrieved from the Internet: URL:http://www.youtube.com/watch?v=eqTFMIVwtpM [retrieved on Oct. 8, 2015].
Chaudhuri et al: "A simple method for fitting of bounding rectangle to closed regions", Pattern Recognition, Elsevier, GB, vol. 40, No. 7, Mar. 30, 2007, pp. 1981-1989, XP022009135.
Gopinath Taget: "Calculating tight bounding box around a solid—AutoCAD DevBlog", Sep. 1, 2013, XP055219673, Retrieved from the Internet: URL:http://adndevblog.typepad.com/autocad/2013/01/calculating-tight-bounding-box-around-a-solid.html [retrieved on Oct. 9, 2015].
Office Action issued Jan. 28, 2020 in corresponding Japanese Patent Application No. 2015-255044 (with English Translation), 8 pages.
Office Action issued Jan. 28, 2020 in corresponding Japanese Patent Application No. 2015-255063 (with English Translation), 7pages.
Miyake Yoshihiro, et al., "Automatic Generation of Simplified Map for Virtual Environments and its Effect," IEICE Technical Report, the Institute of Electronics, Information and Communication Engineers, Japan, vol. 105, No. 433, Nov. 17, 2005, pp. 7-11 (with English Abstract).
Office Action issued Mar. 30, 2020 in China Patent Application No. 201511036087.9 (with English-language translation); 20 pgs.
Azam Khan, et al ; "ViewCube: A 3D Orientation Indicator and Controller"; Proceedings of the 2008 Symposium on Interactive 3D; I3D 2008; Redwood City, California: Feb. 16-17, 2008: 2008 ACM 978-1-59593-983-8/08/0002 (10 pgs.).

\* cited by examiner

SELECTION OF A VIEWPOINT OF A SET OF OBJECTS IN A BOUNDING BOX

CROSS-REFERENCE TO RELATED APPLICATIONS

This application claims priority under 35 U.S.C. § 119 or 365 to European Application No. 14307217.1, filed Dec. 30, 2014. The entire teachings of the above application(s) are incorporated herein by reference.

FIELD OF THE INVENTION

The invention relates to the field of computer programs and systems, and more specifically to a method, system and program for selecting a viewpoint of a set of objects.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In CAD systems, the user deals with assemblies of objects that comprise thousands of objects. In that regard, the user encounters difficulties for easily centering the view on an assembly to a particular zone and with a particular orientation. A known solution to this problem is to provide a global reference frame with X, Y, Z directions together with the loaded assembly in the 3D scene: the global reference frame can be rotated upon user action, and the viewpoint on the assembly follows the rotation of the reference frame. The user can therefore change the view on the assembly. Another known solution are tools providing camera alignment on particular faces of the model.

However, these solutions do not provide quick access to align the point of view on a specific zone of the assembly. Usually, a first point of view change has to be done manually in the 3D scene by the user, and then point to the right location. In addition, these solutions are generic and do not provide an accurate view on a dedicated area of a large assembly with a minimum user interaction.

Within this context, there is still a need for improving the selection of a viewpoint on a large assembly of objects.

SUMMARY OF THE INVENTION

It is therefore provided a computer-implemented method for selecting a viewpoint of a set of objects in a bounding box. The bounding box comprises at least one volume wherein the set of objects is enclosed. The method comprises identifying faces of the at least one volume, associating with each identified face a viewpoint on the set of object, selecting, upon user action, one of the faces associated with one viewpoint, and displaying a view of the set of objects according to the viewpoint associated with the selected face.

The method may further comprise:

- identifying faces of the at least one volume comprises: determining an outline of the at least one volume; identifying one or more visible faces inside the outline; and identifying one or more non-visible faces associated with at least one portion of the outline;
- the step of selecting one of the faces further comprises: detecting a user action at a given distance of a portion of the outline; selecting the non-visible face associated with the portion of the outline near which the user action has been detected;
- the bounding box and the at least one volume are one among a rectangular cuboid, a cube;
- before identifying faces of the at least one volume, the steps of: providing a set of objects forming an assembly, the objects of the set being three-dimensional modeled objects and the assembly being a three-dimensional modeled assembly; computing a simplified view of the three-dimensional modeled assembly, the computed simplified view being a view of one three-dimensional objects representing the assembly with a reduced scale and forming one single mesh; displaying the simplified view, the at least one volume being represented on the simplified view and enclosing the representation of the three-dimensional modeled of the simplified view;
- the step of computing the simplified view of the three-dimensional modeled assembly comprises: associating a transformation matrix with the assembly of three-dimensional modeled objects, the transformation matrix representing a set of information of the three-dimensional modeled objects of the assembly; and computing the simplified view from the transformation matrix and the assembly, the computed simplified view being the view of one three-dimensional object representing the assembly with a reduced scale and forming one single mesh;
- the set of information represented by the transformation matrix comprises at least: an orientation (x,y,z) of the objects in the three-dimensional scene, said orientation using the global orientation of the three-dimensional scene; a scale factor; and the position of the three-dimensional modeled objects in the three-dimensional scene;
- the simplified view is displayed in a three-dimensional scene which is different from the three-dimensional scene wherein the view of the set of objects is displayed;

the step of selecting one of the faces associated with one viewpoint is carried out on the simplified view on which the at least one volume is represented.

It is further provided a computer program comprising instructions for performing the above method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
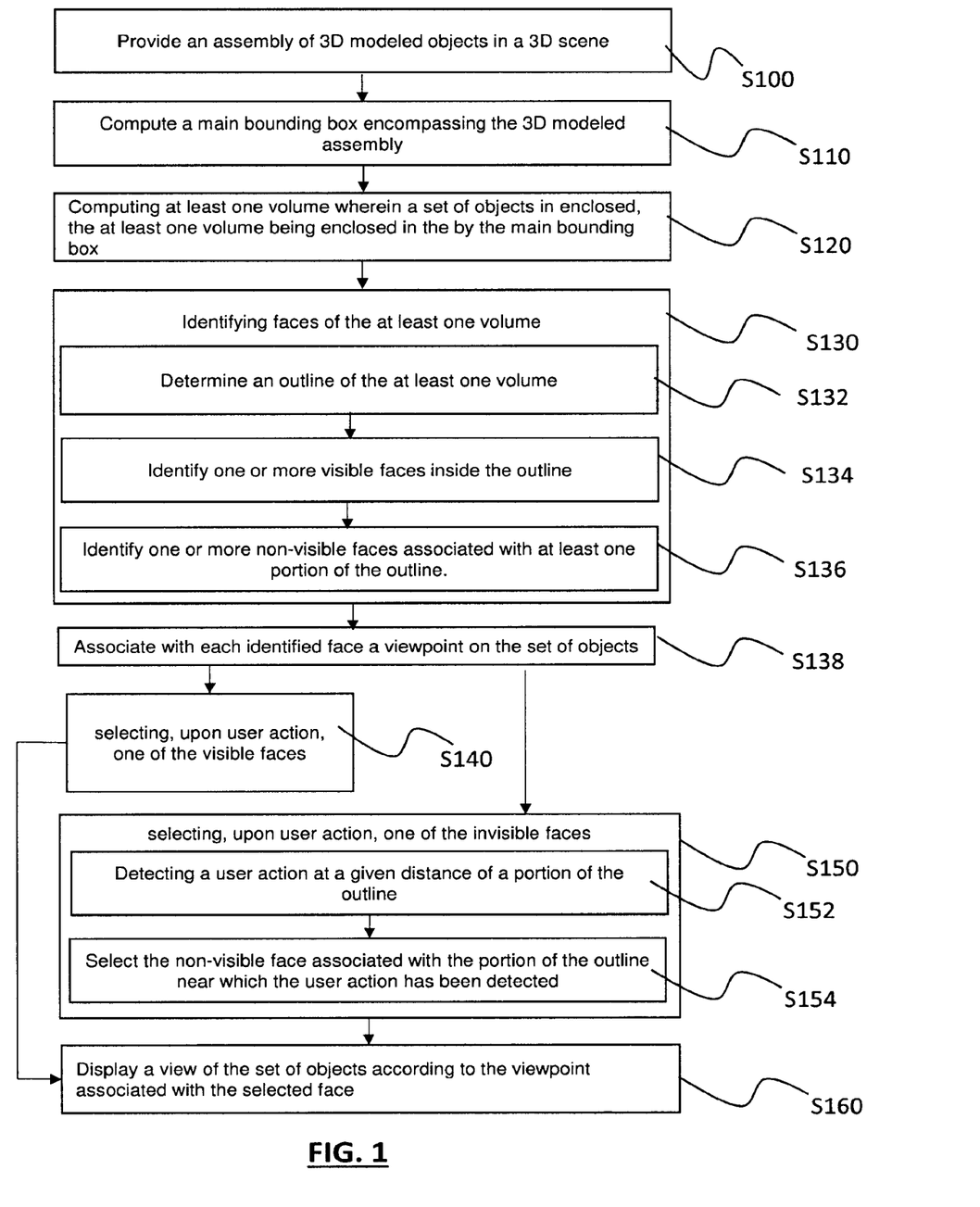
FIG. 1 shows a flowchart of an example of the method.

With reference to the flowcharts of FIG. 1, it is proposed a computer-implemented method for selecting a viewpoint of a set of objects in a bounding box, the bounding box comprising at least one volume wherein the set of objects is enclosed. The objects may be three-dimensional (3D) modeled objects, and the assembly may be a 3D modeled assembly. The method comprises identifying faces of the at least one volume. The method further comprises associating with each identified face a viewpoint on the set of object. The viewpoint (or point of view) is different for each face. The method also comprises selecting one of the faces associated with one viewpoint. The selection is typically performed by a user. The method also comprises displaying a view of the set of objects according to the viewpoint associated with the selected face.

This method improves the selection of a viewpoint on a large assembly of objects. Indeed, the user can exploit the division of an assembly into zones (that is, into bounding volumes) for selecting one viewpoint. In particular, the user has access to all relevant viewpoints without changing the current viewpoint; he only needs to select one face of one of the bounding box enclosing some of the objects of the assembly of objects. Hence, computing resources are saved as no view change has to be performed in order to obtain the display the good view; indeed, the user has the visibility and the access to all volumes at a glance.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

For instance, the step of providing 3D modeled objects (S100 of FIG. 1) may be triggered upon user action. As another example, the selecting steps S140, S150 are also performed upon user action.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

In method of the present invention, the objects of the assembly of 3D modeled objects can be stored on a memory. The computed bounding boxes may also be stored on the memory.

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method generally manipulates modeled objects, e.g. representing a product such as a part or an assembly of parts, or possibly an assembly of products. A modeled object is any object defined by data stored in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is meant any system adapted for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

CAM stands for Computer-Aided Manufacturing. By CAM solution, it is meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

CAE stands for Computer-Aided Engineering. By CAE solution, it is meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Interestingly, the present invention is not limited to CAD/CAE/CAM/PDM or PLM systems, and it can be used with any system that uses 3D representations of objects and that may be dedicated to non-CAD users, e.g. system for performing technical illustrations, maintenance or training operations, assembly presentation, interactive application such as interactive parts catalogues, a designing/authoring system . . . . It is to be understood that the modeled objects may be defined by different kinds of data.

Figure 6:
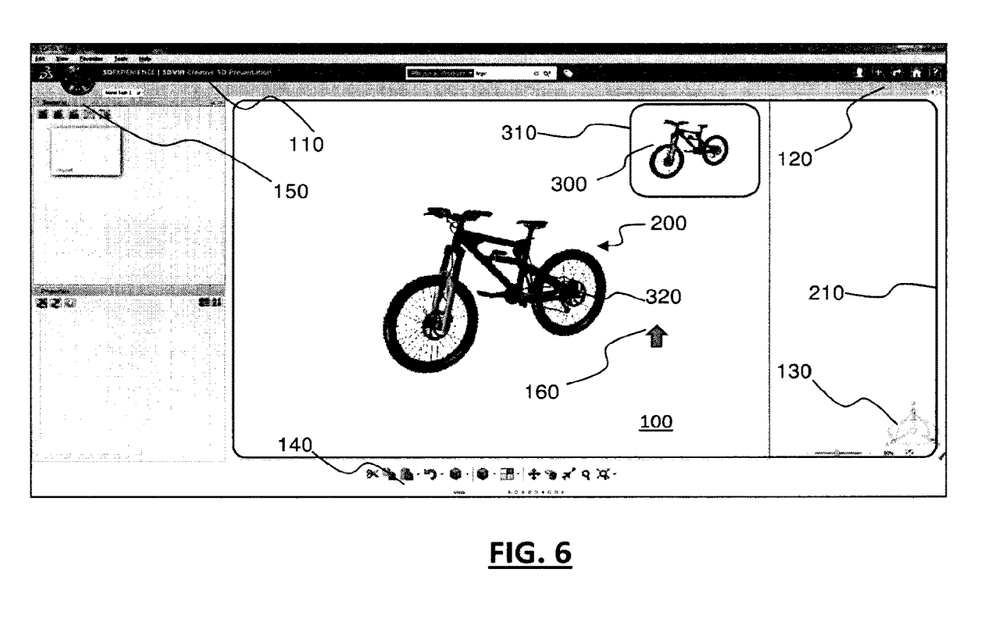
FIG. 6 shows an example of a graphical user interface of the system.

FIG. 6 shows an example of a GUI of a system for performing technical illustrations. The present method can be used with any kind GUI.

The GUI 100 may be a typical CAD-like interface, having standard menu bars 110, 120, as well as bottom 140 and side toolbars. Such menu- and toolbars contain a set of user-selectable icons, each icon being associated with one or more operations or functions, as known in the art. Some of these icons are associated with software tools, adapted for editing and/or working on the 3D modeled object 200 displayed in the GUI 100. It is to be understood that the 3D modeled object 200 is a 3D modeled assembly of 3D modeled objects. The software tools may be grouped into workbenches. Each workbench comprises a subset of software tools. In particular, one of the workbenches is an edition workbench, suitable for editing geometrical features of the modeled product 200. In operation, a designer may for example pre-select a part of the object 200 and then initiate an operation (e.g. adding an annotation for completing the technical illustration). As another example, the designer may pre-select a part of the object 200 and then edit geometrical constraints by selecting an appropriate icon. For example, typical CAD operations are the modeling of the punching or the folding of the 3D modeled object displayed on the screen.

The GUI 100 may further show various types of graphic tools 130, 150 for example for facilitating 3D orientation of the object, for triggering a simulation of an operation of an edited product or render various attributes of the displayed product 200. A cursor 160 may be controlled by a haptic device to allow the user to interact with the graphic tools.

Figure 10:
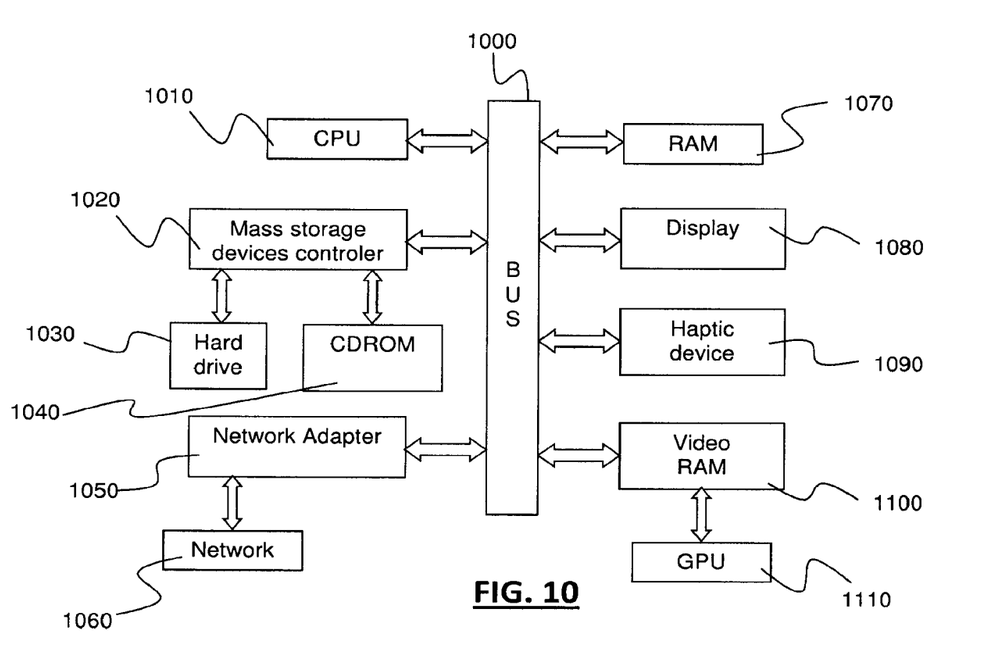
FIG. 10 shows an example of a system for performing the invention.

FIG. 10 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Referring now to FIG. 1, at step S100, 3D modeled objects forming a 3D modeled assembly in a 3D scene are provided. Providing 3D modeled objects means that the objects are available to the system performing the present method. The 3D modeled objects may be displayed, e.g. on the display 1080 of the system of FIG. 10.

Figure 5:
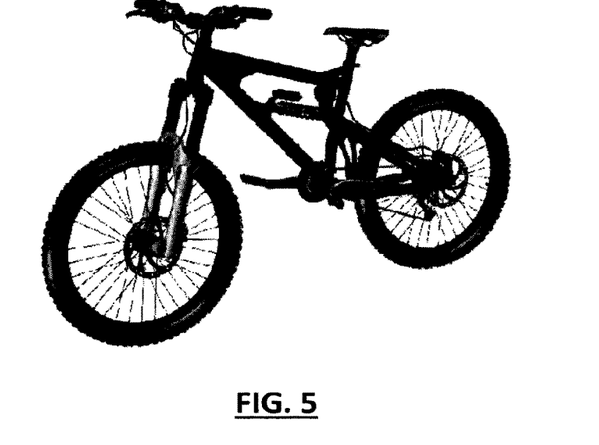
FIG. 5 shows an example of a view of a 3D modeled assembly of 3D modeled objects.

FIG. 5 shows an example of a 3D modeled assembly of 3D modeled object: here a bike is modeled. FIG. 6 shows the bike 200 of FIG. 5 displayed on the GUI 100. The 3D modeled assembly is displayed within a 3D scene. The 3D scene is a space in which spatial relationships between 3D objects are described, e.g. the 3D modeled object forming the bike are position and oriented in the 3D scene.

Next, at step S110 of FIG. 1, a main bounding box encompassing the 3D modeled assembly is computed. This is performed as known in the art. As a result, all the provided objects of step S100 are enclosed in the main bounding box.

Then, at step S120, at least one volume in the 3D scene is computed. This volume is enclosed the main bounding box computed at step S110. The computed volume encloses a set of 3D modeled objects of the 3D modeled assembly.

Figure 2:
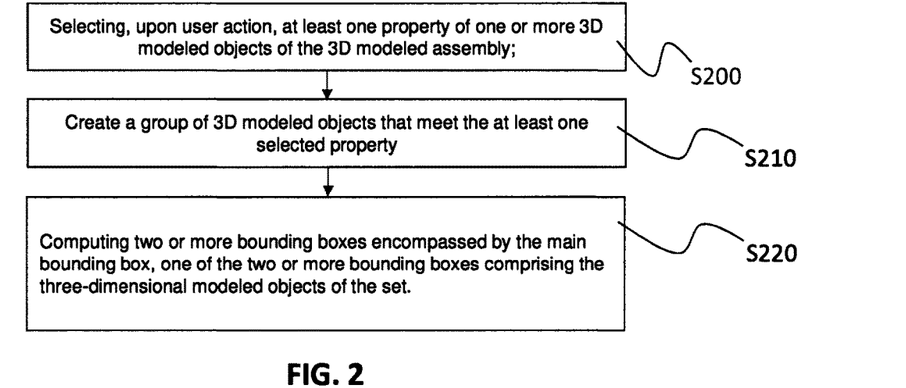
FIGS. 2 and 3 show flowchart of a method for providing a set of bounding boxes.
Figure 3:
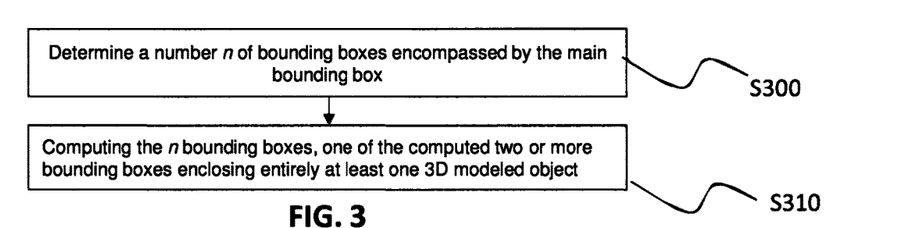

An examples of computing the volume of step S120 are now discussed in reference to FIGS. 2 and 3.

At step S200 of FIG. 2, the user performs the selection of at least one property of one or more 3D modeled objects provided at step S100. The property may a physical property of the object such as material parameter of the object, rendering property of the object such as its color, the level of an object in the product structure of the 3D modeled assembly, a property of the database on which the 3D modeled is stored—the database can be a PLM database—, a property that is created by the user from any attribute of an object of the assembly . . . . Generally speaking, the term property can encompass any characteristic of the object(s). For instance, the creation date of an object, the position of the object in the 3D scene, the designer allowed to work on the object (or any other read/write/execute access right . . . ), are attributes related to one or more objects, and therefore are properties of the object(s).

Next, at step S210, a group of 3D modeled objects is created. It is to be understood that the group can comprises one or more 3D modeled objects. The objects of the group meet the one or more properties selected by the users. For instance, if the user selected the property "blue objects", a group of objects rendered in blue (or to be rendered in blue) is created.

An object can belong to several groups when two or more properties are selected by the user. In such a case, the number of groups an object can belong to may be limited; for instance, an object cannot belong to more than three groups. This advantageously limits the number of groups. In addition, priority rules may exist between the properties of an object. The object that might belong to several groups will belong to the group associated with the property having the highest priority.

Now, at step S220, two or more bounding boxes are computed. These bounding boxes are encompassed in the main bounding box; said otherwise, they are completely enclosed in the main bounding box. One of these two or more bounding boxes comprises the 3D modeled objects that belong the group created at step S210.

In practice, the computing of the bounding boxes relies on the positions of the objects in the 3D scene. In an example, the bounding boxes are computed by identifying barycenter in a system of weighted points. In a first step, a cloud of points is computed in the 3D scene wherein the points represents the outlines of the 3D modeled objects of a created group. Then, this is successively performed for all the groups of objects, including objects that do not belong to a group. The cloud of points thus comprises points that belong to groups (e.g. a particular color is given to points according to the group they belong to), and the points of the cloud are weighted, e.g. according to the volume of or the number of triangles of the object where it came from. Next, for each points of a given group, the barycenter is computer, as known in the art. And then, a bounding box for the group of 3D modeled objects is computed that uses the barycenter as center of the volume defined by the bounding box. This is performed for each group. Importantly, there is no recovery of overlap or intersection between the computed bounding boxes.

Figure 8A:
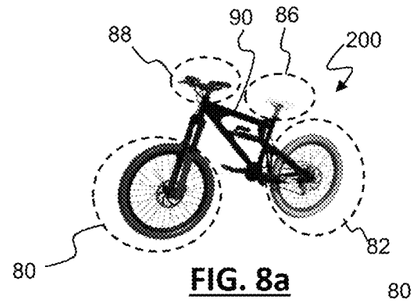
FIGS. 8*a* and 8*b* show examples of bounding boxes enclosing objects.
Figure 8B:
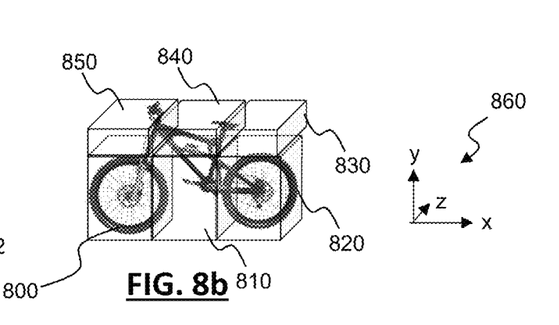

Referring now to FIGS. 8a and 8b, it is shown an example of bounding boxes computed after that the user has selected for property the color of the objects. The user has selected four colors as properties, namely red, green, yellow and pink. Five groups have been identified as a result of this user selection: the first group corresponds to the front wheel 80 that is in red, the second one corresponds to the rear wheel 82 that is in green, the third one is the seat 86 in yellow, the fourth one is handle bar 88 in pink. The last group of 3D modeled objects is the bike frame 90; this groups has been implicitly created and comprises the objects that do not meet the colors selected as property. Each group of object is surrounded by a dotted circle. Six bounding boxes 800, 810, 820, 830, 840, 850 have been computed as shown on FIG. 8b. In this example, it is a requirement of the system that the entire volume defined by the main bounding box (not represented) has to be used by the computed bounding boxes, and that the computed bounding boxes are rectangular cuboid. It results that the sixth bounding boxes are arranged as shown on FIG. 9b. Interestingly, the bounding box 830 is an empty one, that is, no object is enclosed (totally or partially) in this bounding box. The bounding box 830 has been created for the purpose of compliance with the following two additional requirements of the system: (i) for one direction of the main bounding box, the main bonding box comprises at the maximum two adjoining superimposed bounding boxes about, and (ii) an interface between the two adjoining superimposed bounding boxes for said one direction of the main bounding box form a layer in the main bounding box, said layer limiting the extension of the other bounding boxes. This allows to create a regular division of the main bounding box; the user can more easily understand how the 3d modeled assembly have been divided. In FIG. 8b, the number of superimposed bounding boxes is limited to two in the direction 'y' (of the reference frame 860 that provides an orientation of the main bounding box); this is not the case for instance for the direction 'x'. In addition, the bounding boxes 850 and 800 creates a layer (not represented) in the direction 'y', and this layer cannot be crossed by any other bounding box. Therefore, all the other superimposed bounding boxes 840, 810 and 830, 820 are on both side of this layer.

Referring now to FIG. 3, it is discussed an example of computation of the volume of step S120 wherein the system automatically selects one or more properties of the three-dimensional modeled assembly.

At step S300, a number n of computed bounding boxes encompassed by the main bounding box is determined by the system. The number n depends on the size of the 3D modeled assembly. The term size means the dimensions of the 3D modeled assembly about its reference frame, that is, the length, width and height of the 3D modeled assembly. The dimensions of the 3D modeled object thus determines the minimal size of a rectangular cuboid or cubic bounding box. Hence, the number of bounding boxes enclosed in the main bounding box can be determined from the dimension of the 3D modeled assembly. For instance, the minimal size of the enclosed bounding boxes can be determined from a ration between the sizes of the main bounding box and of enclosed bounding boxes. In practice, the ratio is such that each enclosed bounding box is readily identifiable by the user.

Once the number n is determined, the dimensions of the enclosed bounding box can be computed. In practice, the n bounding boxes have are also compliant with the following rules: (i) for one direction of the main bounding box, the main bonding box comprises at the maximum two adjoining superimposed bounding boxes about, (ii) an interface between the two adjoining superimposed bounding boxes for said one direction of the main bounding box form a layer in the main bounding box, said layer limiting the extension of the other bounding boxes, (iii) the entire volume defined by the main bounding box has to be used by the computed bounding boxes, and (iv) the computed bounding boxes are rectangular cuboids or cubes.

Figure 7:
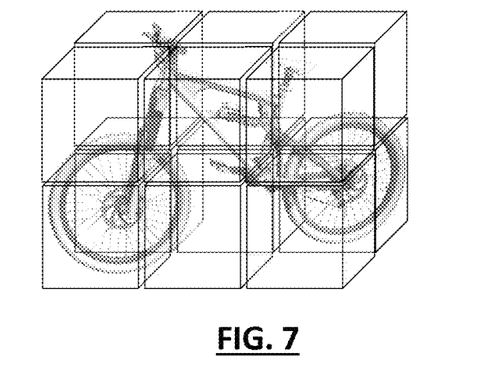
FIG. 7 shows examples of bounding boxes enclosing objects.

FIG. 7 shows an example of bounding boxes encompassed by the main bounding box that are determined by the system. Twelves cubes are enclosed in the main bounding box (not represented), and these twelves bounding boxes have the same dimensions.

Referring back to FIG. 1, at step S130, face of the at least one volume are identified. This means that a list of faces of each bounding box enclosed in the main bounding box is established. A face of a volume is a planar surface that forms part of the boundary of the volume and that is limited by at least three edges. For instance, each cube of FIG. 7 have six faces, each faces being delimited by four edges.

The identification of faces may comprises the identification of one or more visible faces and the identification of one or more non-visible faces. In practice, the rendering of the 3D volume in the 3D scene is a projection in a 2D space (the pixels of a display), as widely known in the art. And only visible faces are represented on the 2D space. Said otherwise, a visible face is a face that is at the forefront, while a non-visible face is in the background.

At step S132, an outline of the at least one volume is determined. The outline delimits a visible outer contour of the volume. The outline of the volume is typically obtained from the projection of the volume at the rendering step.

Figures 9A, 9B:
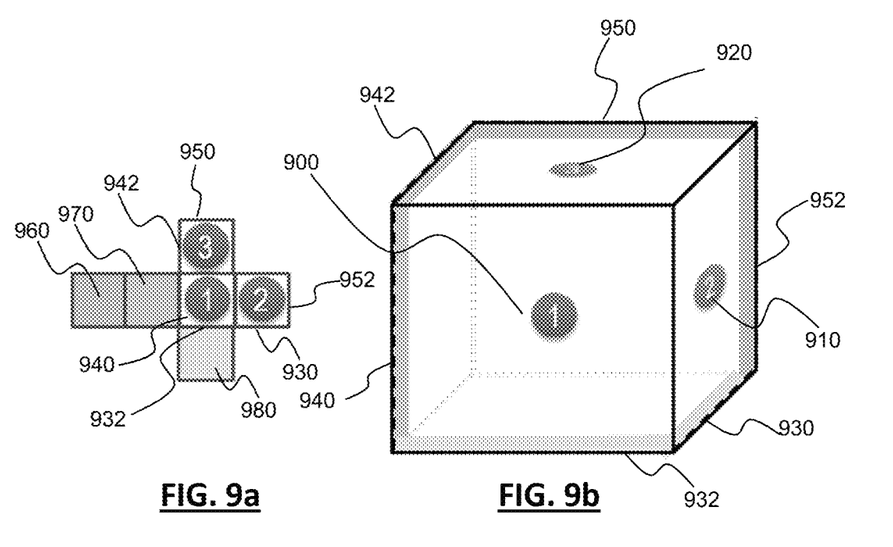
FIGS. 9*a-b* show an example of selection of hidden faces of a bounding box.

For instance, FIG. 9b shows in dotted lines the outline of a cube that is rendered (e.g. on the GUI 100 of FIG. 6) with a perspective view.

Next, at step S134, one or more visible faces inside the outline are identified. This is performed as known in the art.

In FIG. 9b, the visible faces 900 (digit 1), 910 (digit 2), 920 (digit 3) are identified.

Then, at step S136, one or more non-visible faces associated with at least one portion of the outline are identified.

In FIG. 9b, the outline is comprised on six edges. Each edge 940, 942, 950, 952, 930, 932 forms a portion of the outline and is associated with two faces: one visible and one non-visible. FIG. 9a shows the unfolded cube of FIG. 9b wherein the non-visible faces 960, 970, 980 are represented. The edge 940 that belongs to the outline is connected to the visible face 900 and the non-visible face 970. As another example, the edge 932 of the outline is connected to the visible face 900 and the non-visible dace 980. The non-visible face 960 is connected to the edges 950 and 952 that belong to the outline.

Thus, at this step of the method, the non-visible faces, that are in the background and associated with a portion of the outline, are now identified. One visible or non-visible identified faces can be selected upon user action.

Then, at step S138, a view point is identified with each identified face. Any viewpoint can be associated with the selected face. The viewpoint is obtained with a camera that is a software object that has a position, an orientation, and a field of view. The camera is responsible to show a view on a volume of the 3D scene wherein the assembly is located, as known in the art. The viewpoint (the camera) is modeled as 3D object (a virtual physical object) that is also located in the 3D scene with the 3D modeled object. In practice, the point of aiming of the viewpoint toward the assembly of 3D modeled objects is a barycenter of the selected face and is perpendicular to the selected face. This ensures that the new view on the set of objects is centered on the display, e.g. the display of the system performing the method. It is to be understood that any configuration of the viewpoint can be associated to a face. In general, the viewpoints associated with the faces are similarly configured, so that the user can more easily comprehend the view displayed as a result of the user selection. Moreover, this limits computing resources consumption on the system performing the method.

At step S140, the user selects a visible face, e.g. the visible face 900 in FIGS. 9a, 9b. This is performed as known in the art. For instance, the user uses the cursor 160 that is controlled by a mouse. The rendering of the visible face 900 may be modified in order to indicate to the user that this visible face can be selected upon user action on the mouse.

At step S160, a view of the set of objects that are comprised in the volume of the selected face is displayed, and this view in obtained from the point of view associated with the selected face.

At step S150, the user wishes to select one of the invisible faces. As seen previously, the invisible faces are in the background so that the user cannot directly select an invisible base.

At step S152, the system detects a user action at a given distance of the portion of the outline. The expression given distance means a range of values. For instance, the user can moves the cursor toward the portion of the outline, and when the value representing the distance between the cursor and the outline belongs to the range of value, the user has the possibility to perform an action in relation with said portion. The distance can be, but is not limited to, a Euclidian distance, a number of pixels . . . . The distance may be measured from/to, but is not limited to, an end of the cursor, the barycenter of the cursor, one of the pixels forming the portion . . . . This is performed as known in the art. Alternatively, an area may be defined on one side or both sides of the portion, and when the user performs an action in this area, the system considers that the user action is done. The rendering of the portion of the outline may be modified in order to indicate to the user that his user action has been detected, e.g. the cursor is in the area.

Then, at step S154, the user selects the non-visible face associated with the portion of the outline near which the user action has been detected. This is performed as known in the art. For instance, the user uses the cursor 160 that is controlled by a mouse and click on the mouse when the cursor is on the portion of the outline.

Then, the step S160 is carried out, as explained previously.

The computed bounding boxes (the main and the enclosed ones) can be represented to the user. For instance, they can be directly shown on the 3D modeled assembly.

Alternatively, they can be shown on a simplified view of the view of the 3D modeled assembly. To this aim, a simplified view of the 3D modeled assembly is computed. The expression simplified view means that the graphical elements of said view are not partitioned according to the individual objects of the assembly, from a system standpoint. This involves for instance that the objects that form the bike of FIG. 5 (for instance a wheel) cannot be selected by the user on the simplified view when displayed. Said otherwise, the set of objects as represented in the simplified view is not content addressable and a user may not select any individual object composing the assembly displayed in the view. The user thus see a simplified model of the assembly.

The simplified view may be a dimmed white colored model, being understood that any other color may be used. The color is preferably unified; this advantageously allows to distinguish it from the original model on the GUT and it enhance the objects related to the information provided. In addition, no material or texture are applied on the representation of the simplified view. This allows a faster computing and rendering of the simplified view and less memory is required.

Figure 4:
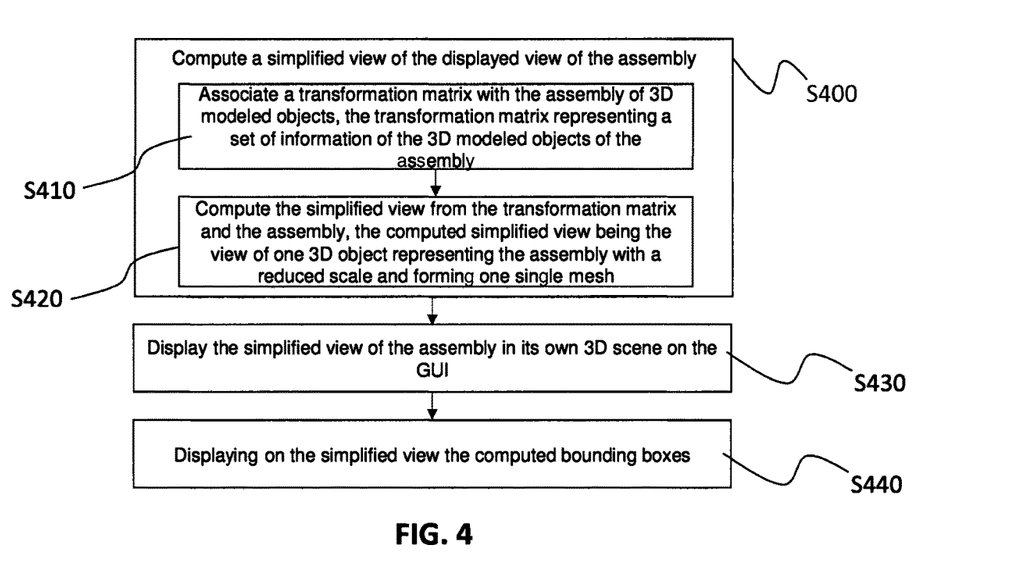
FIG. 4 shows a flowchart of an example of the display of bounding boxes enclosing objects.

The computing of the simplified view may comprise a step S410 of FIG. 4 associating a transformation matrix with the assembly of 3D modeled objects. The transformation matrix represents a set of information relative to the 3D modeled objects of the assembly. In this context, the term association means that data representing the transformation matrix are stored together with data representing said one object; the data can be physically stored (for instance in a same file) or stored logically (for instance in two files with a pointer from a file to a second one).

The transformation matrix aims at providing a linear transformation between two spaces, as known in the art. For instance, the transformation matrix allows transformation from the 3D space of the assembly to the 3D space of the simplified view. The transformation matrix allows to perform operations such as, but limited to, translation, rotation, scaling on the assembly (or on a sub-assembly, or on a 3D modeled object) in the 3D space. Interestingly, the transformation matrix can be easily inverted such that an operation on the simplified view can be applied on the assembly.

The set of information represented by the transformation matrix comprises at least an orientation and a position of the assembly in the 3D scene. The orientation and positions of the assembly are defined as the orientation and position of a reference frame—for instance a frame of three axis (x,y, z)—attached to the assembly relative to the global frame (also referred to as frame of reference) of the 3D scene, as known in the art. The set of information further comprises a scale factor, which is the same (that is, the same value) as the one that is used for obtaining the simplified view representing the assembly with a reduced scale.

An association is created between the assembly of 3D modeled objects and the transformation matrix so that is possible to create a link between the assembly located in a first 3D space and the simplified view located in a second 3D space. Interestingly, one transformation matrix may be associated with each object of the assembly: this means that the assembly is associated with as many transformation matrices as objects in the assembly, and one transformation matrix comprises a set of information related to one of the objects of the assembly. Said otherwise, the assembly is associated with a transformation matrix for each object of the assembly. This advantageously allows to improve the accuracy of the link created between the simplified view and the assembly as the granularity used is the object and not the set of objects forming the assembly.

Then, the simplified view is computed from the transformation matrix and the assembly of 3D modeled objects. This is performed as known in the art. The computed simplified view is the view of a 3D object (also referred to simplified model) representing the assembly with a reduced scale, e.g. with a scale factor of 1/10 (the simplified view is ten times smaller than the assembly of objects). Reducing the scale is different than a zoom out which is a manipulation of the representation so as to make it smaller only, while reducing the scale involves that a transformation (a shrinking) of the objects forming the assembly is carried out before obtaining a representation.

Moreover, the said one 3D object (or simplified model) forms one single mesh. This means that only one mesh is obtained as an aggregate of sub-meshes, wherein each sub-mesh is the mesh of an object of the assembly. Thus, an aggregate representation is processed to form a view to be rendered next. The aggregation of the meshes is performed as known in the art. The term mesh means a set of vertices, edges and faces that defines the shape of a modeled object in 3D. In practice, the faces may be triangles, quadrilaterals, or other simple convex polygons. The mesh of the simplified view if thus a simplified mesh compared to the mesh of the assembly; less memory is required for displaying the simplified view.

The computing of the simplified view may be preceded by a simplification based on various criteria, such as a threshold size (possibly user parameterized) or sag, that is, an entry parameter used for tessellated representations of the objects, as known in the art. Hence, not all the parts of the set need be used during the aggregation (for example, rivets of a plane would be discarded if the entire airplane is displayed). Further, parts contained in other parts (therefore masked) need not be used in the aggregation. Other criteria may be used to discard some of the objects, for example user selectable categories of parts.

Interestingly, the computed simplified view makes a critical difference in terms of memory required to display the view. Indeed, while the simplified view typically requires a few memory resources (for instance several Kbytes), a view containing all representations of the parts may require up to thousands of megabytes to be loaded in the computer memory. Thanks to the scale reduction and the computing of one single mesh, the view is more rapidly computed and rendered.

Then, the simplified view obtained from the computing step S400 of FIG. 4 is displayed within the 3D scene on the GUI The 3D space wherein the simplified view is displayed is not the same as the one wherein the assembly is displayed. Said otherwise, the assembly of 3D modeled object is displayed in a first 3D scene and the simplified view of the assembly of 3D modeled object is displayed in a second 3D scene, both scene being displayed on the same GUI. Said otherwise, the simplified view is displayed in a 3D scene which is different from the 3D scene of the displayed assembly.

In practice, this is performed by displaying two windows on the GUI, as illustrated on FIG. 6. The bike 200 and the simplified view 300 of the simplified model are displayed on the same GUI 100, but in two different windows. The window 310 shows the 3D space wherein the simplified view 300 is displayed and the window 210 shows the 3D space wherein the assembly 200 is displayed; these two 3D spaces are not the same: they have their own global orientation.

Next, the computed bounding boxes are displayed on the simplified view. The positioning of bounding boxes on the simplified view is computed with the transformation matrix. In practice, the (mathematical) product between coordinates of the bounding boxes in the 3D scene and the transformation matrix provides new coordinates of the said bounding boxes in the 3D scene of the simplified view. For instance, the bike of FIG. 7 (or FIG. 8b) might be seen as an example of a simplified view together with several volumes enclosing a simplified representations of sets of 3D objects, and this simplified view might be displayed in the window 300 of FIG. 6. Hence, the user can perform the selection of a viewpoint directly on the simplified view, and the view is displayed in the main window 210. By this way, the user can easily and directly access to all relevant viewpoints without changing the current viewpoint; he only needs to select one face of one of the bounding box on the simplified representation.

The preferred embodiments of the present invention have been described. It will be understood that various modifications may be made without departing from the spirit and scope of the invention. Therefore, other implementations are within the scope of the following claims.

The invention claimed is:

1. A computer-implemented method for selecting a viewpoint of a set of objects in a bounding box by user interaction with a graphical user interface (GUI) of a computer system, a processor being coupled to a display comprising the GUI, the main bounding box encompassing several respective bounding boxes each enclosing one respective object of the set of objects, each respective bounding box being a respective cuboid rectangle or cube wherein the one respective object respective to the respective bounding box is enclosed, the method comprising, for each respective bounding box of one or more respective bounding boxes:
    identifying faces of the cuboid rectangle or cube that is the respective bounding box, each face of the cuboid rectangle or cube being a planar surface of the cuboid rectangle or cube, by:
        determining an outline of the cuboid rectangle or cube that is the respective bounding box,
        identifying one or more visible faces inside the outline, and
        identifying one or more non-visible faces each associated with a respective portion of the outline that forms a boundary of the planar surface that forms the face to which the respective portion is associated, each non-visible face forming a planar surface of the cuboid rectangle or cube that is completely non-visible to the user and for which the user can only see its respective associated portion and nothing else as long as the non-visible face is not selected;
    associating with each identified visible face and non-visible face a pre-configured viewpoint on the respective object enclosed in the respective bounding box;
    selecting one of the visible or non-visible faces associated with one pre-configured viewpoint where:
    a visible face is selected, upon user action, in the GUI, on the planar surface that is the visible face to be selected, and
    a non-visible face is selected, upon user action, in the GUI, at a given distance of the respective outline portion that forms a boundary of the planar surface that is the non-visible face to be selected, the selection of the non-visible face including:
        in response to user input, moving a cursor controlled by a haptic device of the computer system toward the outline portion,
        by the computer system, detecting that the distance between the cursor and the outline portion belongs to a predefined range of values, by the computer system, enabling the user to select the non-visible face upon the detection that the distance between the cursor and the outline portion belongs to a predefined range of values, and
in response to user input, selecting the non-visible face by a clicking on the outline portion; and
displaying, automatically by the processor on the GUI, a view of the set of objects according to the pre-configured viewpoint associated with the selected face.

2. The computer-implemented method of claim 1, wherein the selecting one of the non-visible faces further comprises:
detecting a user action at a given distance of a portion of the outline; and
selecting the non-visible face associated with the portion of the outline near which the user action has been detected.

3. The computer-implemented method of claim 1, wherein the bounding box is one among a rectangular cuboid, a cube.

4. The computer-implemented method of claim 1, further comprising, before identifying faces of the cuboid rectangle or cube:
providing a set of objects forming an assembly, the objects of the set being three-dimensional modeled objects and the assembly being a three-dimensional modeled assembly;
computing a simplified view of the three-dimensional modeled assembly, the computed simplified view being a view of one three-dimensional objects representing the assembly with a reduced scale and forming one single mesh; and
displaying the simplified view, the cuboid rectangle or cube being represented on the simplified view and enclosing the representation of the three-dimensional modeled of the simplified view.

5. The computer-implemented method of claim 4, wherein computing the simplified view of the three-dimensional modeled assembly comprises:
associating a transformation matrix with the assembly of three-dimensional modeled objects, the transformation matrix representing a set of information of the three-dimensional modeled objects of the assembly; and
computing the simplified view from the transformation matrix and the assembly, the computed simplified view being the view of one three-dimensional object representing the assembly with a reduced scale and forming one single mesh.

6. The computer-implemented method of claim 5, wherein the set of information represented by the transformation matrix comprises at least:
an orientation (x,y,z) of the objects in a three-dimensional scene, said orientation using the global orientation of the three-dimensional scene;
a scale factor; and
the position of the three-dimensional modeled objects in the three-dimensional scene.

7. The computer-implemented method according to claim 4, wherein the simplified view is displayed in a three-dimensional scene which is different from the three-dimensional scene wherein the view of the set of objects is displayed.

8. The computer-implemented method of claim 7, wherein the selecting one of the faces associated with the one pre-configured viewpoint is carried out on the simplified view on which the cuboid rectangle or cube is represented.

9. A non-transitory computer readable storage medium having recorded thereon a computer program that when executed by a computer causes the computer to execute the method of claim 1.

10. A computer system for selecting a viewpoint of a set of objects in a bounding box by user interaction with a graphical user interface (GUI) of a computer system, a processor being coupled to a display comprising the GUI, the main bounding box encompassing several respective bounding boxes each enclosing one respective object of the set of objects, each respective bounding box each respective cuboid rectangle or cube wherein the one respective object respective to the respective bounding box is enclosed, the system comprising processing circuitry coupled to a memory and the graphical user interface, the memory having recorded thereon instructions that when executed by the processing circuitry cause the processing circuitry to be configured to, for each respective bounding box of one or more respective bounding boxes:
identify faces of the cuboid rectangle or cube that is the respective bounding box, each face of the cuboid rectangle or cube being a planar surface of the cuboid rectangle or cube, by being configured to:
determine an outline of the cuboid rectangle or cube that is the respective bounding box,
identify one or more visible faces inside the outline, and
identify one or more non-visible faces each associated with a respective portion of the outline that forms a boundary of the planar surface that forms the face to which the respective portion is associated, each non-visible face forming a planar surface of the cuboid rectangle or cube that is completely non-visible to the user and for which the user can only see its respective associated portion and nothing else as long as the non-visible face is not selected;
associate with each identified visible face and non-visible face a pre-configured viewpoint on the respective object enclosed in the respective bounding box;
select one of the visible or non-visible faces associated with one pre-configured viewpoint where:
a visible face is selected, upon user action, in the GUI, on the planar surface that is the visible face to be selected, and
a non-visible face is selected, upon user action, in the GUI, at a given distance of the respective outline portion that forms a boundary of the planar surface that is the non-visible face to be selected, the selection of the non-visible face including the processing circuitry being configured to:
in response to user input, move a cursor controlled by a haptic device of the computer system toward the outline portion,
by the computer system, detect that the distance between the cursor and the outline portion belongs to a predefined range of values,
by the computer system, enable the user to select the non-visible face upon the detection that the distance between the cursor and the outline portion belongs to a predefined range of values, and
in response to user input, select the non-visible face by a clicking on the outline portion; and
display, automatically by the processor on the GUI, a view of the set of objects according to the pre-configured viewpoint associated with the selected face.

11. The computer system of claim 10, wherein the processing circuitry is further configured to select one of the non-visible faces by being further configured to:
- detect a user action at a given distance of a portion of the outline; and
- select the non-visible face associated with the portion of the outline near which the user action has been detected.

12. The computer system of claim 10, wherein the bounding box is one among a rectangular cuboid, a cube.

13. The computer system of claim 10, wherein the processing circuitry is further configured to, before identifying faces of the cuboid rectangle or cube:
- provide a set of objects forming an assembly, the objects of the set being three-dimensional modeled objects and the assembly being a three-dimensional modeled assembly;
- compute a simplified view of the three-dimensional modeled assembly, the computed simplified view being a view of one three-dimensional objects representing the assembly with a reduced scale and forming one single mesh; and
- display the simplified view, the cuboid rectangle or cube being represented on the simplified view and enclosing the representation of the three-dimensional modeled of the simplified view.

14. The computer system of claim 13, wherein the processing circuitry is configured to compute the simplified view of the three-dimensional modeled assembly by being further configured to
- associate a transformation matrix with the assembly of three-dimensional modeled objects, the transformation matrix representing a set of information of the three-dimensional modeled objects of the assembly; and
- compute the simplified view from the transformation matrix and the assembly, the computed simplified view being the view of one three-dimensional object representing the assembly with a reduced scale and forming one single mesh.

15. The computer system of claim 14, wherein the set of information represented by the transformation matrix comprises at least:
- an orientation (x,y,z) of the objects in a three-dimensional scene, said orientation using the global orientation of the three-dimensional scene;
- a scale factor; and
- the position of the three-dimensional modeled objects in the three-dimensional scene.

16. The computer system of claim 13, wherein the simplified view is displayed in a three-dimensional scene which is different from the three-dimensional scene wherein the view of the set of objects is displayed.

17. The computer system of claim 16, wherein the selection of one of the faces associated with one pre-configured viewpoint is carried out on the simplified view on which the cuboid rectangle or cube is represented.

* * * * *